(12) United States Patent
Huang et al.

(10) Patent No.: US 7,071,095 B2
(45) Date of Patent: Jul. 4, 2006

(54) BARRIER METAL RE-DISTRIBUTION PROCESS FOR RESISTIVITY REDUCTION

(75) Inventors: Cheng-Lin Huang, Hsinchu (TW); Ching-Hua Hsieh, Hsinchu (TW); Shau-Lin Shue, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/850,763

(22) Filed: May 20, 2004

(65) Prior Publication Data

US 2005/0260851 A1    Nov. 24, 2005

(51) Int. Cl.
*H01L 21/4763* (2006.01)

(52) U.S. Cl. .................. 438/627; 438/643; 438/653

(58) Field of Classification Search .............. 438/627, 438/643, 653, FOR. 355, FOR. 489
See application file for complete search history.

(56) References Cited

U.S. PATENT DOCUMENTS

| 6,538,324 | B1 * | 3/2003 | Tagami et al. .............. 257/751 |
| 6,764,940 | B1 * | 7/2004 | Rozbicki et al. ............ 438/627 |
| 6,841,468 | B1 * | 1/2005 | Friedemann et al. ........ 438/627 |
| 2002/0084181 | A1 * | 7/2002 | Gopalraja et al. ..... 204/192.12 |
| 2003/0034244 | A1 * | 2/2003 | Yasar et al. .............. 204/192.3 |

FOREIGN PATENT DOCUMENTS

JP                10223566 A    *    8/1998

* cited by examiner

*Primary Examiner*—Michelle Estrada
(74) *Attorney, Agent, or Firm*—Tung & Assoc.

(57) ABSTRACT

A novel process for re-distributing a barrier layer deposited on a single damascene, dual damascene or other contact opening structure. The process includes providing a substrate having a contact opening structure and a metal barrier layer deposited in the contact opening structure, re-sputtering the barrier layer by bombarding the barrier layer with argon ions and metal ions, and re-sputtering the barrier layer by bombarding the barrier layer with argon ions.

16 Claims, 3 Drawing Sheets

BARRIER METAL RE-DISTRIBUTION PROCESS FOR RESISTIVITY REDUCTION

FIELD OF THE INVENTION

The present invention relates to processes for the back-end-of-line (BEOL) deposition of metal barrier layers in damascene structures. More particularly, the present invention relates to a novel, two-step re-sputter process for the re-distribution of metal in a barrier layer in a damascene structure to reduce flat field thickness and via bottom thickness of the barrier layer, as well as increase trench and via sidewall coverage.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner. The various layers define circuit components or devices such as transistors.

After the individual devices have been fabricated on the substrate, they must be connected together to perform the desired circuit functions. This interconnection process is generally known as "metallization" and is performed using a number of different photolithographic, deposition, and removal techniques. In one interconnection process, called a "dual damascene" technique, two interconnect channels of conductor materials are separated by interlayer dielectric layers in vertically separated planes perpendicular to each other and interconnected by a vertical connection, or "via", at their closest point.

While there exist many variations of a dual-damascene process flow, the process typically begins with deposition of a silicon dioxide dielectric layer of desired thickness which corresponds to the thickness for the via or vias to be etched in the dielectric layer. Next, a thin etch stop layer, typically silicon nitride, is deposited on the dielectric layer. Photolithography is then used to pattern via openings over the etch stop layer, after which dry etching is used to etch via openings in the etch stop layer.

The patterned photoresist is then stripped from the etch stop layer after completion of the etch. A remaining dielectric layer the thickness of which corresponds to the thickness of the trench for the metal interconnect lines is then deposited on the etch stop layer, and photolithography followed by dry etching is used to pattern the trenches in the remaining dielectric layer and the vias beneath the trenches. The trench etching stops at the etch stop layer, while the vias are etched in the first dielectric layer through the openings in the etch stop layer and beneath the trenches.

Next, a barrier material, typically Ta, TaN, W, WN, Ti, TiN, TiZr or TiZrN is deposited on the sidewalls and bottoms of the trenches and vias using ionized PVD. A uniform copper seed layer is then deposited on the barrier layer using CVD. After the trenches and vias are filled with copper in a single copper inlay step, the copper overburden extending from the trenches is removed and the upper surfaces of the metal lines planarized using CMP.

In the dual damascene process described above, the vias and the trenches are etched in the same step, and the etch stop layer defines the bottom of the trenches. In other variations, the trench is patterned and etched after the via. In the single damascene process, the vias and trenches are individually, rather than simultaneously, filled with copper inlays.

A significant advantage of the dual-damascene process is the creation of a two-leveled metal inlay which includes both via holes and metal line trenches that undergo copper fill at the same time. This eliminates the requirement of forming the trenches for the metal interconnect lines and the holes for the vias in separate processing steps. The process further eliminates the interface between the vias and the metal lines.

Another important advantage of the dual-damascene process is that completion of the process typically requires 20% to 30% fewer steps than the traditional aluminum metal interconnect process. Furthermore, the dual damascene process omits some of the more difficult steps of traditional aluminum metallization, including aluminum etch and many of the tungsten and dielectric CMP steps. Reducing the number of process steps required for semiconductor fabrication significantly improves the yield of the fabrication process, since fewer process steps translate into fewer sources of error that reduce yield.

In both the single damascene and dual damascene techniques, the via sidewalls and via bottom are typically subjected to a reactive clean and physical argon ion bombardment process prior to deposition of the barrier layer onto those surfaces. This is illustrated in FIG. 1A, in which a dual damascene structure 10 is subjected to argon ion bombardment prior to deposition of a metal barrier layer 2 (FIG. 1B) on the structure 10. The dual damascene structure 10 includes a typically copper conductive layer 20, on which is sequentially deposited a via dielectric layer 22 and a trench dielectric layer 24. A via opening 26 and a trench opening 28 are etched in the via dielectric layer 22 and the trench dielectric layer 24, respectively.

During the argon ion bombardment cleaning process, argon ions 18 are directed against the trench sidewalls 12, the via sidewalls 14 and the via bottom 16 of the structure 10. However, the argon ion bombardment process has a tendency to cause re-sputtering of metal particles 21 from the conductive layer 20 at the via bottom 16, onto the via sidewalls 14. This disrupts the structural integrity of the damascene profile, adversely affecting device reliability and performance.

As a result of the metal re-sputtering of the conductive layer 20 which frequently occurs during the argon ion bombardment cleaning process, the barrier layer 2 subsequently deposited on the sidewalls and bottom of the trench opening 28 and via opening 26 frequently forms overhangs (excessive flat field thickness) 4 at the upper corners of the trench opening 28 and via opening 26; non-uniform sidewall coverage; and an excessively thick bottom layer 3 at the bottom of the via opening 26.

One solution to this problem involves re-sputtering of the metal atoms in the barrier layer 2 using argon to improve sidewall coverage and reduce the thickness of the barrier layer at the bottom of the via opening. However, this re-sputtering process has a tendency to further damage the damascene structure profile, thereby increasing the sheet resistance of copper interconnects subsequently formed in the via opening and trench opening. This phenomenon is particularly problematic in the fabrication of metal interconnects having ever-shrinking sizes, as is the case with regard to interconnects having a line width on the nanometer scale (such as 90 nm and 60 nm technology).

Accordingly, particularly in the fabrication of damascene or other contact structures for nanometer-scale interconnect technology, a novel process for re-distributing a barrier layer is needed to eliminate or reduce overhang in the barrier layer at the upper corners of via and trench openings; enhance uniformity in sidewall coverage; and reduce the thickness of the barrier layer at the bottom of the via openings.

An object of the present invention is to provide a novel process which is suitable for re-distributing a metal barrier layer deposited on the sidewalls and bottoms of trenches and vias or other contact openings in a contact structure.

Another object of the present invention is to provide a novel process which is suitable for re-distributing a metal barrier layer to fabricate metal interconnects of low electrical resistance on a substrate.

Still another object of the present invention is to provide a novel barrier layer re-distribution process which is effective in enhancing sidewall coverage and eliminating or reducing overhangs and bottom thickness in a barrier layer deposited on the sidewalls and bottom of trenches and vias in a damascene or other contact structure.

Yet another object of the present invention is to provide a novel barrier metal re-distribution process which may include depositing a barrier metal on the sidewalls and bottoms of a trench opening and via opening or other contact opening, subjecting the barrier layer to a first re-sputter step using both argon and barrier metal ion bombardment, and subjecting the barrier layer to a second re-sputter step using argon ion bombardment only.

Another object of the present invention is to provide a novel barrier metal re-distribution process which includes depositing a barrier metal on the sidewalls and bottoms of a trench opening and via opening or other contact opening on a substrate; placing the substrate in a PVD (physical vapor deposition) chamber; subjecting the barrier layer to a first re-sputter step using both argon and tantalum ion bombardment, with the DC source of the PVD chamber on; and subjecting the barrier layer to a second re-sputter step using argon ion bombardment only, with the DC source of the PVD chamber off.

SUMMARY OF THE INVENTION

In accordance with these and other objects and advantages, the present invention is generally directed to a novel process for re-distributing a barrier layer deposited on a single damascene, dual damascene or other contact opening structure. The process enhances sidewall coverage uniformity, eliminates or reduces the incidence of overhangs in the barrier layer at the top and bottom corners of trenches and vias, and reduces the thickness of the barrier layer at the bottom of the vias. The process includes fabrication of a single damascene, dual damascene or other contact opening structure on a substrate; optionally pre-cleaning the structure typically using nitrogen or hydrogen plasma; depositing a thin metal barrier layer on the sidewalls and bottom of the structure; and re-distributing or re-sputtering the barrier layer on the bottom and sidewalls of the structure typically in a two-step re-sputter process.

In a first re-sputter step, the barrier layer is placed in a PVD (physical vapor deposition) chamber and subjected to both argon ion bombardment and barrier metal ion bombardment. This step enhances sidewall coverage in the trenches, vias or other openings in the contact structure. In a second re-sputter step, the barrier layer is subjected to argon bombardment only. This step re-distributes the barrier metal along the sidewalls and bottoms of the trenches and vias to eliminate or reduce overhangs, provide substantially uniform sidewall coverage and reduce the thickness of the barrier layer at the bottom of the via or other contact structure.

BRIEF DESCRIPTION OF THE DRAWINGS

The invention will be better understood, by way of example, with reference to the accompanying drawings, in which.

DETAILED DESCRIPTION OF THE INVENTION

The present invention has particularly beneficial utility in the re-distribution of a metal barrier layer in via and trench openings during the formation of a dual damascene interconnect structure on a semiconductor wafer substrate. However, the invention is not so limited in application, and while references may be made to such dual damascene interconnect structure, the invention is more generally applicable to the re-distribution of metal barrier layers in contact openings during the formation of single damascene or other contact opening structures during the fabrication of semiconductor integrated circuits.

Figure 1A:
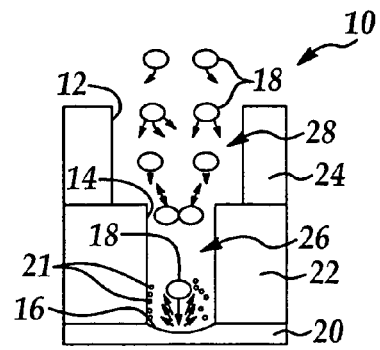
FIGS. 1A and 1B are cross-sectional views of a damascene structure, illustrating a conventional process for depositing a barrier layer metal in trench and via openings.
Figure 1B:
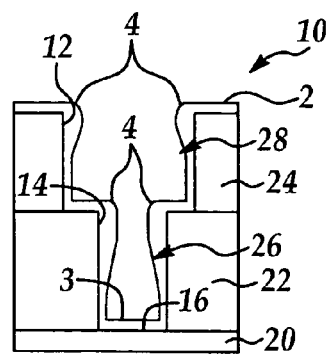
Figure 2A:
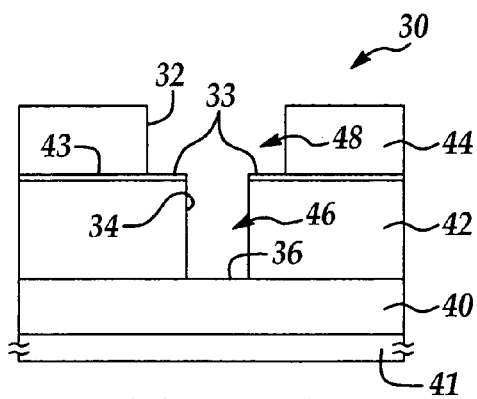
FIGS. 2A–2C are cross-sectional views illustrating fabrication of a damascene structure preparatory to implementation of the re-sputtering process of the present invention.

Referring initially to FIG. 2A, a cross-section of a dual damascene structure in implementation of the present invention is generally indicated by reference numeral 30. Briefly, the dual damascene structure 30 includes a typically copper conductive layer 40 which is deposited on a wafer substrate 41 typically using conventional deposition processes known by those skilled in the art. While there exist many variations of the dual damascene interconnect fabrication process, the process typically begins with deposition of a via dielectric layer 42 of desired thickness which corresponds to the thickness of a via opening 46 to be etched in the via dielectric layer 42. Next, a thin etch stop layer 43, typically silicon nitride, is deposited on the via dielectric layer 42.

Conventional photolithography techniques are then used to deposit and pattern a photoresist layer (not shown) on the etch stop layer 43, after which the via opening 46 is etched through the etch stop layer 43 and underlying via dielectric layer 42, to the upper surface of the conductive layer 40. After completion of the etch, the patterned photoresist is stripped from the etch stop layer 43.

A trench dielectric layer 44, the thickness of which corresponds to the thickness of a trench opening 48 to be etched therein, is then deposited on the etch stop layer 43. Photolithography, followed by dry etching, is used to pattern the trench openings 48 in the trench dielectric layer 44. The trench etching stops at the etch stop layer 43, while the via opening 46 extends through the via dielectric layer 42 beneath the trench opening 48.

The patterned photoresist for the trench opening 48 is then stripped from the trench dielectric layer 44. Accordingly, the via opening 46 includes vertical via sidewalls 34, as well as a via bottom 36 which corresponds to the upper surface of the conductive layer 40. The trench opening 48 directly overlies the via opening 46 and includes vertical trench sidewalls 32 and a trench bottom 33.

Figure 2B:
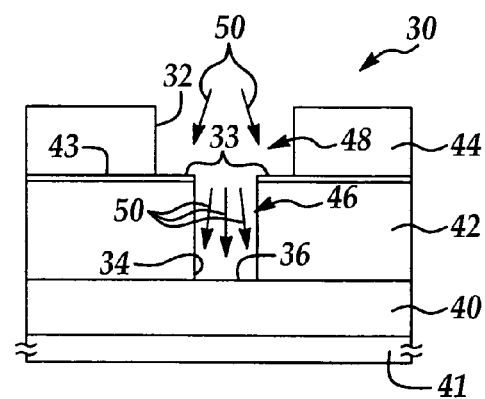

Referring next to FIG. 2B, an ionized cleaning gas 50, such as argon or a reactive plasma, may then be used to clean and remove particles from the trench sidewalls 32, the via sidewalls 34, the trench bottom 33 and the via bottom 36. It is understood that the ionized gas cleaning process of FIG. 2B is optional and may be omitted for purposes of the present invention.

Figure 2C:
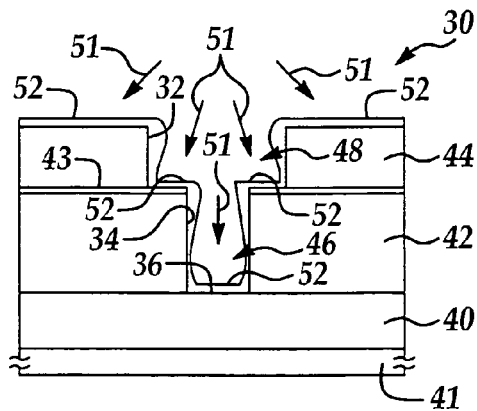

Referring next to FIG. 2C, a barrier metal 51 is next deposited on the trench sidewalls 32, the via sidewalls 34 and the via bottom 36, typically using a high kinetic energy plasma deposition process, to define a metal barrier layer 52 on those surfaces. In a preferred embodiment, the barrier metal 51 is applied to the surfaces at an input power of typically from about 80 to about 800 watts/square inch of target area for a time period of typically about 0.1~60 sec. This results in a continuous barrier layer 52 which extends along the trench sidewalls 32, the via sidewalls 34, and the via bottom 36.

In a preferred embodiment, the barrier layer 52 has a thickness of typically from about 25 Å to about 650 Å. The barrier layer 52 is preferably tantalum (Ta), since tantalum is an ideal candidate for copper interconnect metallurgy. Other suitable metals for the barrier layer 52 include tantalum nitride (TaN), tantalum silicon (TaSi), tantalum silicon nitride (TaSiN), titanium (Ti), titanium nitride (TiN), titanium zirconium (TiZr), titanium zirconium nitride (TiZrN), tungsten (W) and tungsten nitride (WN), for example.

Figure 2D:
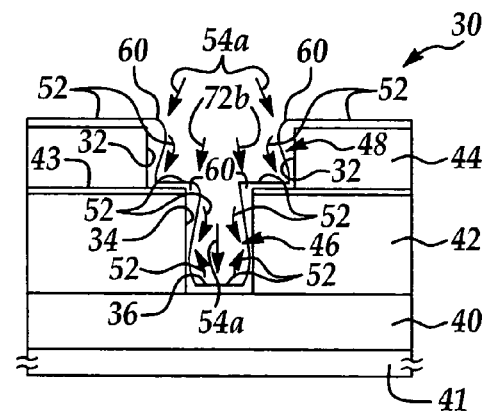
FIG. 2D is a cross-sectional view of a damascene structure, illustrating re-distribution or re-sputtering of a metal barrier layer using both argon and barrier metal ions in a first step according to the process of the present invention.

Referring next to FIG. 2D, application of the barrier metal 51 to the structure 30, as heretofore described with respect to FIG. 2C, results in deposition of a barrier layer 52 having a variable thickness. Specifically, overhangs 60 are typically formed in the barrier layer 52 at the upper portions of either or both of the via sidewalls 34 and the trench sidewalls 32. Moreover, the barrier layer 52 at the lower portion of either or both of the trench sidewalls 32 and via sidewalls 34 is excessively thin with respect to the barrier layer 52 at the upper portion of the trench sidewalls 32 and via sidewalls 34. Furthermore, the portion of the barrier layer 52 at the bottom of the via opening 46 may be excessively thick.

The thickness of the barrier layer 52 must be substantially uniform for optimum deposition of a seed layer on the barrier layer 52 in a subsequent processing step. According to the process of the present invention, the barrier layer 52 is subjected to a two-step re-distribution or re-sputtering process to render the thickness of the barrier layer 52 more uniform along the trench sidewalls 32 and via sidewalls 34; eliminate or minimize the overhangs 60; and reduce the thickness of the barrier layer 52 at the bottom of the via opening 46. This re-sputtering process is shown in FIGS. 2D, 2E, 4A and 4B.

Figure 4A:
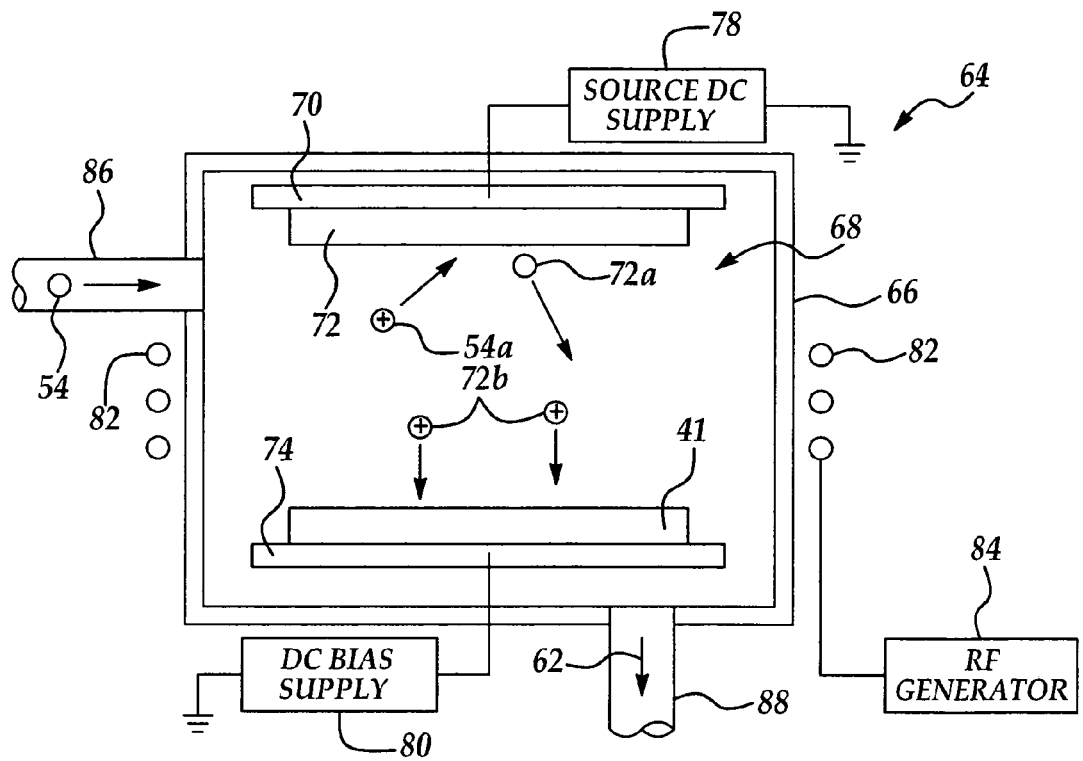
FIG. 4A is a schematic of a metal plasma PVD chamber in implementation of a first re-sputtering step according to the present invention.

Referring to FIG. 4A, the process of the present invention may be carried out in an ionized PVD (physical vapor deposition) chamber 64. The chamber 64 typically includes a chamber wall 66 that defines a chamber interior 68. A source electrode 70, connected to a source DC supply 78, is provided in the top of the chamber interior 68. A bias electrode 74, connected to a bias DC supply 80, is provided in the bottom of the chamber interior 68. An RF coil 82 surrounds the chamber 64 and is connected to an RF generator 84. A gas inlet 86 and a gas outlet 88 communicate with the chamber interior 68 for the introduction of argon gas 54 into and the evacuation of reaction products and unreacted plasma 62 from, respectively, the chamber interior 68.

A metal target 72 is provided in contact with the source electrode 70 for the sputtering of metal ions 72b from the target 72 onto the barrier layer 52 in the via opening 46 and trench opening 48 (FIG. 2D), as hereinafter described. Accordingly, the metal target 72 is composed of the same metal as the barrier layer 52. Preferably, both the barrier layer 52 and the metal target 72 are tantalum.

Referring to FIG. 2D, in a first re-distribution or re-sputtering step according to the process of the present invention, shown in FIG. 2D, the barrier layer 52 is subjected to bombardment by argon ions 54a and metal ions 72b to re-distribute some of the barrier layer material 52 from the overhangs 60 to the underlying trench sidewall 32 and via sidewall 34 to increase sidewall coverage with the barrier layer 52. The portion of the barrier layer 52 at the via bottom 36 is also subjected to bombardment by the argon ions 54a and metal ions 72b, to thin the barrier layer 52 and redistribute some of the barrier layer material 52 from the via bottom 36 and onto the via sidewalls 34.

Referring to FIG. 4A, the first re-sputtering step of FIG. 2D is carried out by placing the substrate 41 on the bias electrode 74 in the ionized PVD chamber 64. As the source DC supply 78 applies a negative voltage to the source electrode 70 and metal target 72, argon gas 54 is introduced into the chamber interior 68 through the gas inlet 86. The radio frequency (RF) power applied to the RF coils 82 by the RF generator 84 forms an RF field which ionizes the argon gas 54 into a plasma, generating positive argon ions 54a.

The argon ions 54a strike the metal target 72, dislodging metal atoms 72a from the target 72. The RF field ionizes the dislodged metal atoms 72a to form positive metal ions 72b. Simultaneously, the bias DC supply 80 applies a bias power voltage to the bias electrode 74 and substrate 41. The positive metal ions 72b are drawn to the negatively-charged substrate 41, causing the metal ions 72b to strike and combine with the barrier layer 52 and increase sidewall coverage of the barrier layer 52 on the trench sidewalls 32 and via sidewalls 34.

Typical process conditions for the first re-sputtering step are as follows: a chamber pressure of 0.5~50 mTorr; an RF power of 100~500 watts; a source DC voltage of 10~700 volts; a bias DC voltage of 10~700 volts; an argon gas flow rate of 1~200 sccm; and a processing time of 0.5~60 seconds.

Figure 2E:
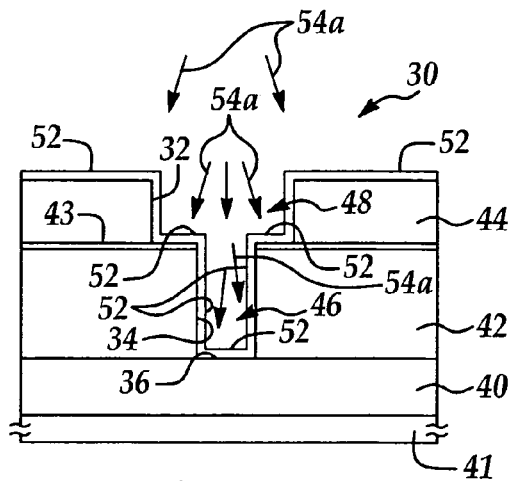
FIG. 2E is a cross-sectional view of a damascene structure, illustrating re-distribution or re-sputtering of the metal barrier layer using argon ion bombardment only in a second step according to the process of the present invention.
Figure 4B:
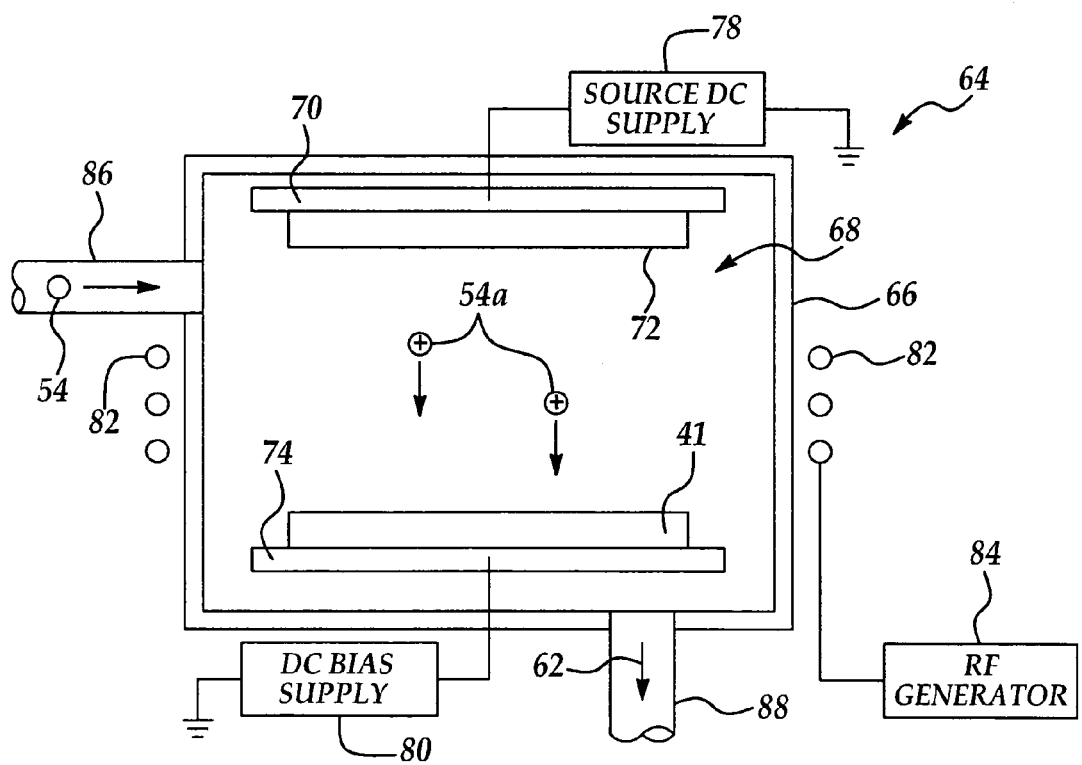
FIG. 4B is a schematic of a metal plasma PVD chamber in implementation of a second re-sputtering step according to the present invention.

Referring next to FIGS. 2E and 4B, the second re-sputtering step according to the process of the present invention is carried out by turning off the source DC supply 78 to prevent a negative source voltage from being applied to the source electrode 70. Simultaneously, a negative voltage is applied to the substrate 41 by the bias DC supply 80. Argon gas 54 is introduced into the chamber interior 68, where the RF field generated by the RF coils 82 ionizes the argon gas 54 into a plasma which contains positive argon ions 54a.

Because the metal target 72 has zero voltage, the argon ions 54a are drawn toward the negatively-charged substrate 41, having a negative voltage applied by the bias DC supply 80. Consequently, as shown in FIG. 2E, the argon ions 54a strike the barrier layer 52 and tend to further re-distribute the barrier layer metal from the overhangs 60 (FIG. 2D) to the trench sidewalls 32 and via sidewalls 34, as well as from the bottom of the via opening 46 onto the via sidewalls 34. Consequently, the overhangs 60 are eliminated or at least minimized; the trench sidewalls 32 and via sidewalls 34 are characterized by a substantially uniform coverage by the barrier layer 60; and the thickness of the barrier layer 52 at the bottom of the via opening 46 is reduced, thereby decreasing via resistance between the conductive layer 40 and a metal interconnect (not shown) subsequently fabricated in the via opening 46 and trench opening 48.

Typical process conditions for the second re-sputtering step are as follows: a chamber pressure of 0.5~50 mTorr; an RF power of 100~5,000 watts; a bias DC voltage of 10~700 volts; an argon gas flow rate of 1~200 scam; and a processing time of 0.5~60 seconds.

Figure 2F:
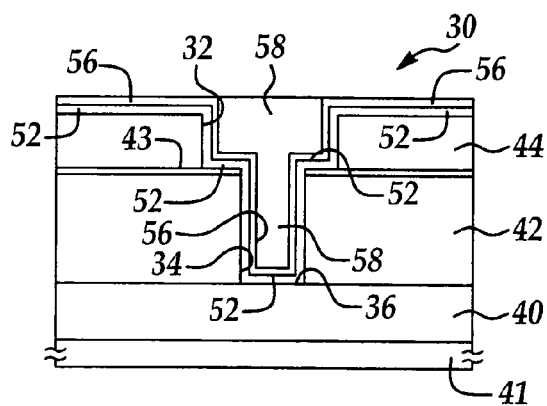
FIG. 2F is a cross-sectional view of the damascene structure, illustrating deposition of a seed layer on the barrier layer after the step of FIG. 2E and inlay of copper in the trench and via of the structure after deposition of the seed layer to complete fabrication of the damascene structure.

Referring next to FIG. 2F, after completion of the two-step re-sputtering process heretofore described with respect to FIGS. 2C and 2D, a typically copper seed layer 56 is deposited on the re-distributed and re-sputtered barrier layer 52. The via opening 46 and the trench opening 48 are then filled with a copper inlay 58, according to the knowledge of those skilled in the art, to form the metal interconnections between devices fabricated on the substrate 41. The copper inlay 58 is typically subjected to chemical mechanical planarization (CMP) to planarize or smooth the upper surface of the copper inlay 58 and complete fabrication of the damascene interconnect structure 30, as is known by those skilled in the art.

Figure 3:
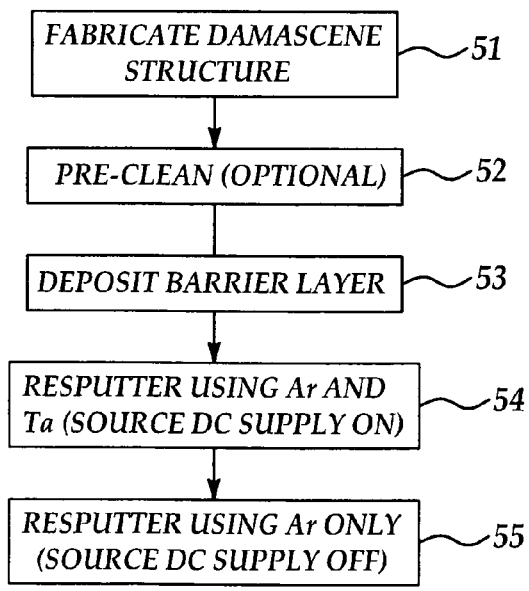
FIG. 3 is a flow diagram which summarizes a typical process flow in accordance with the method of the present invention.

A typical process flow for the process of the present invention is summarized in FIG. 3. In process step S1, a single damascene, dual damascene or other contact opening structure is fabricated on a substrate. In process step S2, the trench sidewalls, via sidewalls, trench bottom and via bottom of the structure are optionally subjected to a reactive plasma cleaning process, typically using reactive nitrogen or hydrogen plasma. In process step S3, a metal barrier layer is deposited on the trench sidewalls, via sidewalls, trench bottom and via bottom.

In process step S4, the barrier layer is re-distributed or re-sputtered in a first re-sputtering step, using both argon ion bombardment and metal ion bombardment, to reduce or eliminate overhang and increase sidewall coverage of the barrier layer metal. The source DC supply remains on during step S4. In process step S5, the barrier layer is subjected to a second re-sputtering step using pure argon ion bombardment without metal ion bombardment. The source DC supply is turned off during step S5. This step further eliminates or reduces overhang, increases sidewall coverage of the trench and via openings, and reduces the thickness of the barrier layer at the bottom of the via opening to reduce via resistance in the finished metal interconnects. Alternatively, the re-sputtering step may be carried out using a pure argon ion bombardment step alone (without metal ion bombardment) or in addition to a prior step including both argon ion bombardment and metal ion bombardment.

It will be appreciated by those skilled in the art that the order of the first re-sputtering step and the second re-sputtering step, as described above, may be reversed in carrying out the present invention. Thus, the first re-sputtering step may include argon ion bombardment (with the source DC power supply turned off), and the second may include argon ion bombardment with metal ion bombardment.

While the preferred embodiments of the invention have been described above, it will be recognized and understood that various modifications can be made in the invention and the appended claims are intended to cover all such modifications which may fall within the spirit and scope of the invention.

What is claimed is:

1. A process for re-distributing a barrier layer, comprising the steps of:
   providing a substrate having a contact opening structure and a metal barrier layer deposited in said contact opening structure; and
   re-sputtering said barrier layer by bombarding said barrier layer with pure argon without metal ion bombardment; and
   re-sputtering the resultant barrier layer by providing a metal target and bombarding said barrier layer with argon and metal ions from said metal target.

2. The process of claim 1, wherein said metal barrier layer is tantalum and said metal ions are tantalum ions.

3. The process of claim 1 wherein said contact opening structure is a dual damascene structure.

4. The process of claim 3 wherein said metal barrier layer is tantalum and said metal ions are tantalum ions.

5. The process of claim 1 wherein said metal barrier layer is titanium and said metal ions are titanium ions.

6. The process of claim 5 wherein said contact opening structure is a dual damascene structure.

7. The process of claim 1 wherein said barrier layer has a thickness of from about 25 angstroms to about 650 angstroms.

8. The process of claim 7 wherein said metal barrier layer is tantalum and said metal ions are tantalum ions.

9. The process of claim 7 wherein contact opening structure is a dual damascene structure.

10. The process of claim 9 wherein said metal barrier layer is tantalum and said metal ions are fantalum ions.

11. The process of claim 7 wherein said metal barrier layer is titanium and said metal ions are titanium ions.

12. The process of claim 11 wherein said contact opening structure is a dual damascene structure.

13. A process for re-distributing a barrier layer, comprising the steps of
    providing a substrate having a contact opening structure and a metal barrier layer deposited in said contact opening structure;
    providing a process chamber comprising a source DC supply;
    placing said substrate in said process chamber;
    re-sputtering said barrier layer by providing a metal target and bombarding said barrier layer with argon ions and metal ions from said metal target with said source DC supply on; and
    re-sputtering said barrier layer by bombarding the resultant barrier layer with argon ions without metal ion bombardment with said source DC supply off.

14. The process of claim 13 wherein said metal barrier layer is tantalum and said metal ions are tantalum ions.

15. The process of claim 13 wherein said metal barrier layer is titanium and said metal ions are titanium ions.

16. The process of claim 13 wherein said contact opening structure is a duel damascene structure.

* * * * *